United States Patent [19]
Sugibayashi

[11] Patent Number: 5,973,970
[45] Date of Patent: Oct. 26, 1999

[54] SEMICONDUCTOR MEMORY DEVICE INCORPORATING REDUNDANCY MEMORY CELLS HAVING UNIFORM LAYOUT

[75] Inventor: Tadahiko Sugibayashi, Tokyo, Japan

[73] Assignee: NEC Corporation, Tokyo, Japan

[21] Appl. No.: 09/246,801

[22] Filed: Feb. 9, 1999

[30] Foreign Application Priority Data

Feb. 10, 1998 [JP] Japan .................................. 10-028240

[51] Int. Cl.$^6$ .................................................. G11C 13/00
[52] U.S. Cl. ................ 365/200; 365/189.01; 365/230.01
[58] Field of Search ............................. 365/200, 189.01, 365/230.01, 205

[56] References Cited

U.S. PATENT DOCUMENTS 5,687,125 11/1997 Kikuchi .................................... 365/200

*Primary Examiner*—Terrell W. Fears
*Attorney, Agent, or Firm*—Young & Thompson

[57] ABSTRACT

A semiconductor memory device includes a plurality of bus lines, normal memory cell arrays, data amplifiers for amplifying data read from the normal memory cell arrays, redundancy memory cell arrays, and redundancy data amplifiers for amplifying data read from the redundancy memory cell arrays. First bus selectors selectively connect the normal data amplifiers to the bus lines and second bus selectors selectively connect the redundancy data amplifiers to the bus lines.

6 Claims, 19 Drawing Sheets

BL : BIT LINE
DL : DIGIT LINE
SA : SENSE AMPLIFIER

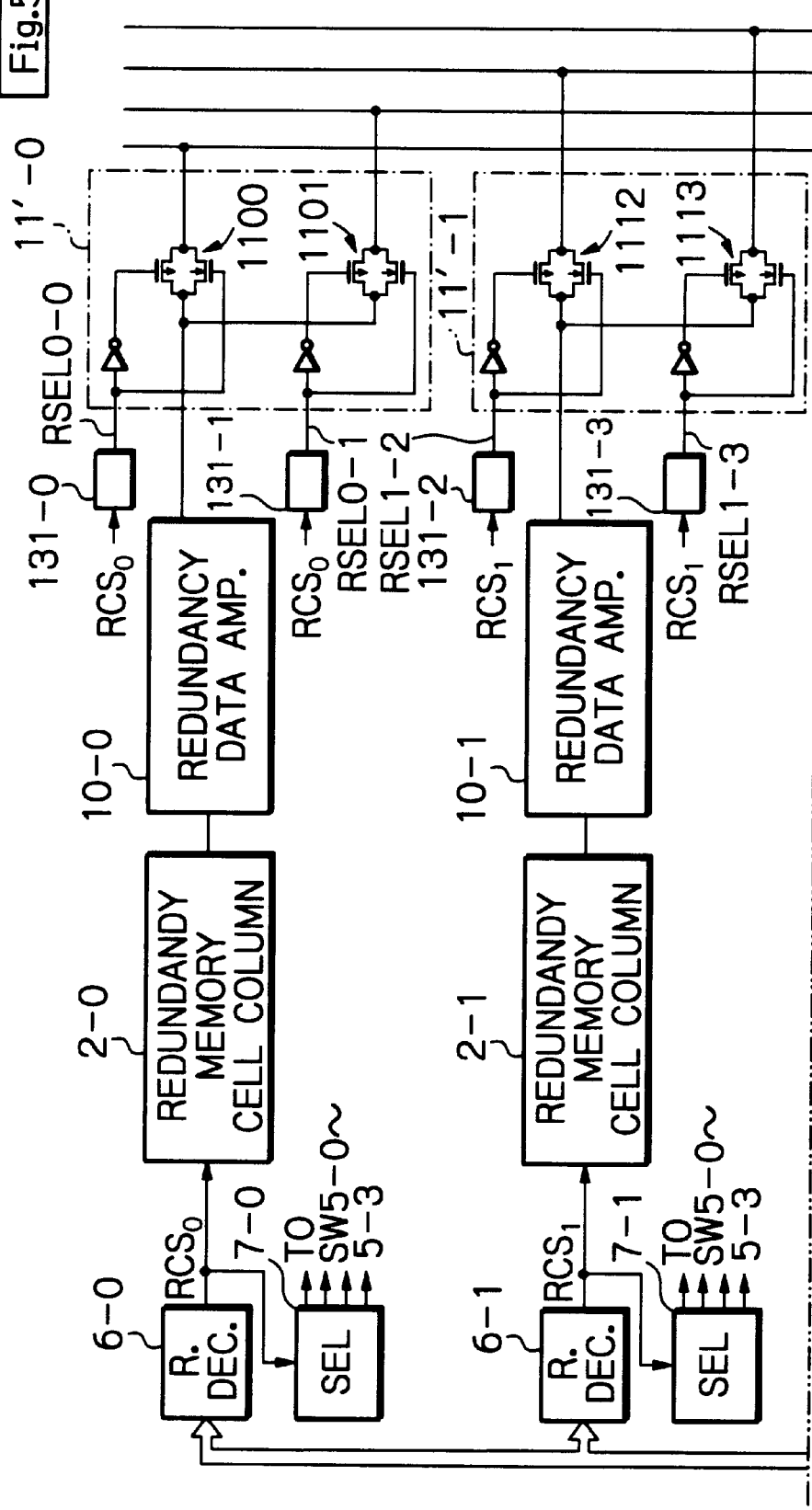

| MODE | NORMAL MEMORY CELL ARRAY | | | | REDUNDANCY MEMORY CELL COLUMN | | SELECTION CIRCUIT | | | |
|---|---|---|---|---|---|---|---|---|---|---|
| | 1-0 | 1-1 | 1-2 | 1-3 | 2-0 | 2-1 | 7-0 | 7-1 | | |
| 1 | RWB 0 | RWB 2 | RWB 1 | RWB 3 | - | - | - | - | | |
| 2 | RWB 0 | RWB 2 | RWB 1 | RWB 3 | - | - | - | - | | |
| 3 | RWB 0 | RWB 2 | RWB 1 | RWB 3 | RWB 0 | - | 5-0 | - | | |
| 4 | RWB 0 | RWB 2 | RWB 1 | RWB 3 | - | RWB 2 | - | 5-1 | | |
| 5 | RWB 0 | RWB 2 | RWB 1 | RWB 3 | RWB 1 | - | 5-2 | - | | |
| 6 | RWB 0 | RWB 2 | RWB 1 | RWB 3 | - | RWB 3 | - | 5-3 | | |
| 7 | RWB 2 | RWB 2 | RWB 1 | RWB 3 | RWB 0 | RWB 2 | 5-0 | 5-1 | | |
| 8 | RWB 2 | RWB 2 | RWB 1 | RWB 3 | RWB 1 | RWB 2 | 5-0 | 5-2 | | |
| 9 | RWB 0 | RWB 2 | RWB 1 | RWB 3 | RWB 1 | RWB 3 | 5-0 | 5-3 | | |
| 10 | RWB 0 | RWB 2 | RWB 3 | RWB 1 | RWB 1 | RWB 2 | 5-1 | 5-2 | | |
| 11 | RWB 0 | RWB 2 | RWB 1 | RWB 3 | RWB 1 | RWB 3 | 5-2 | 5-3 | | |

☐ MEMORY CELL ARRAY
▨ MEMORY CELL HAVING DEFECTIVE MEMORY CELL

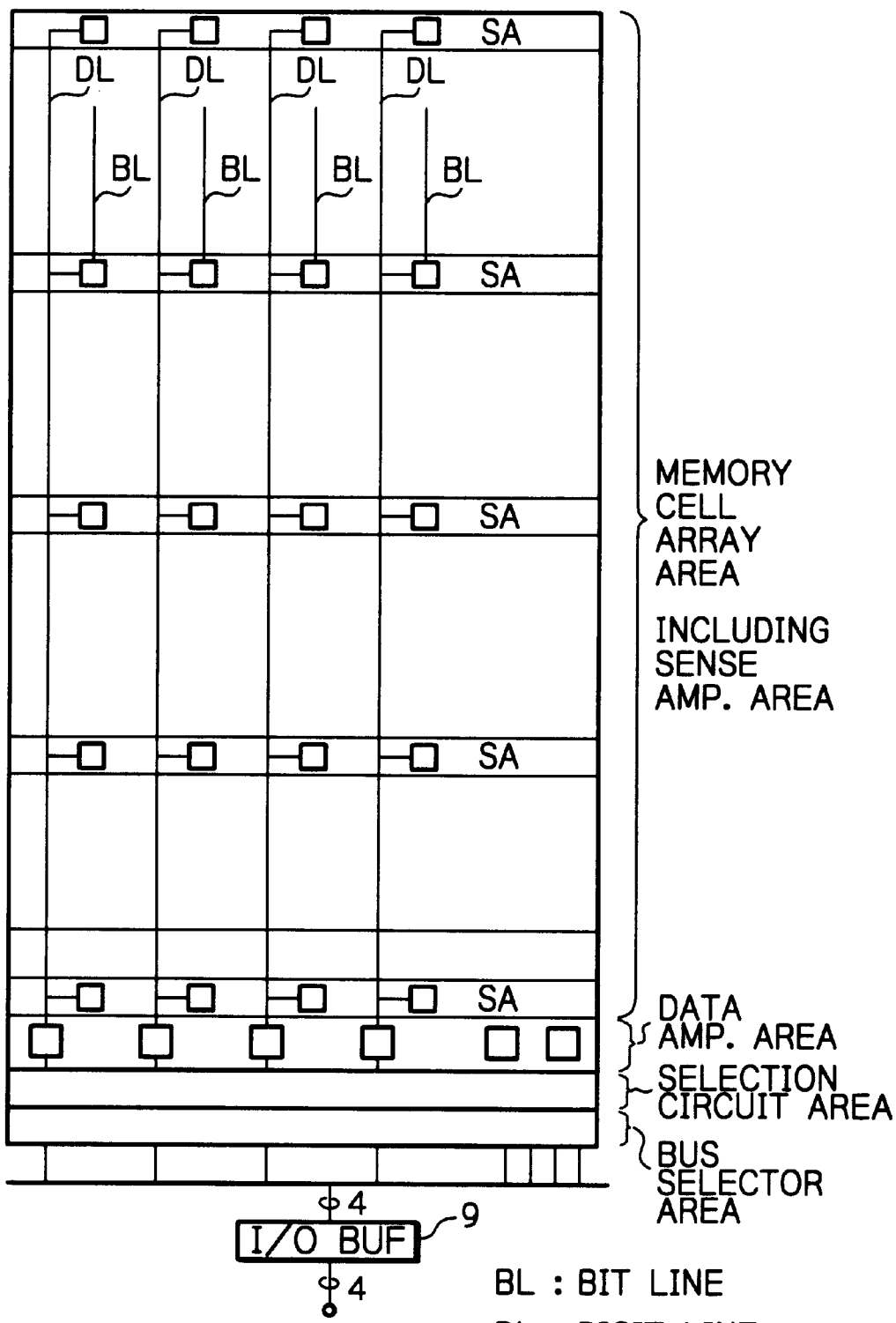

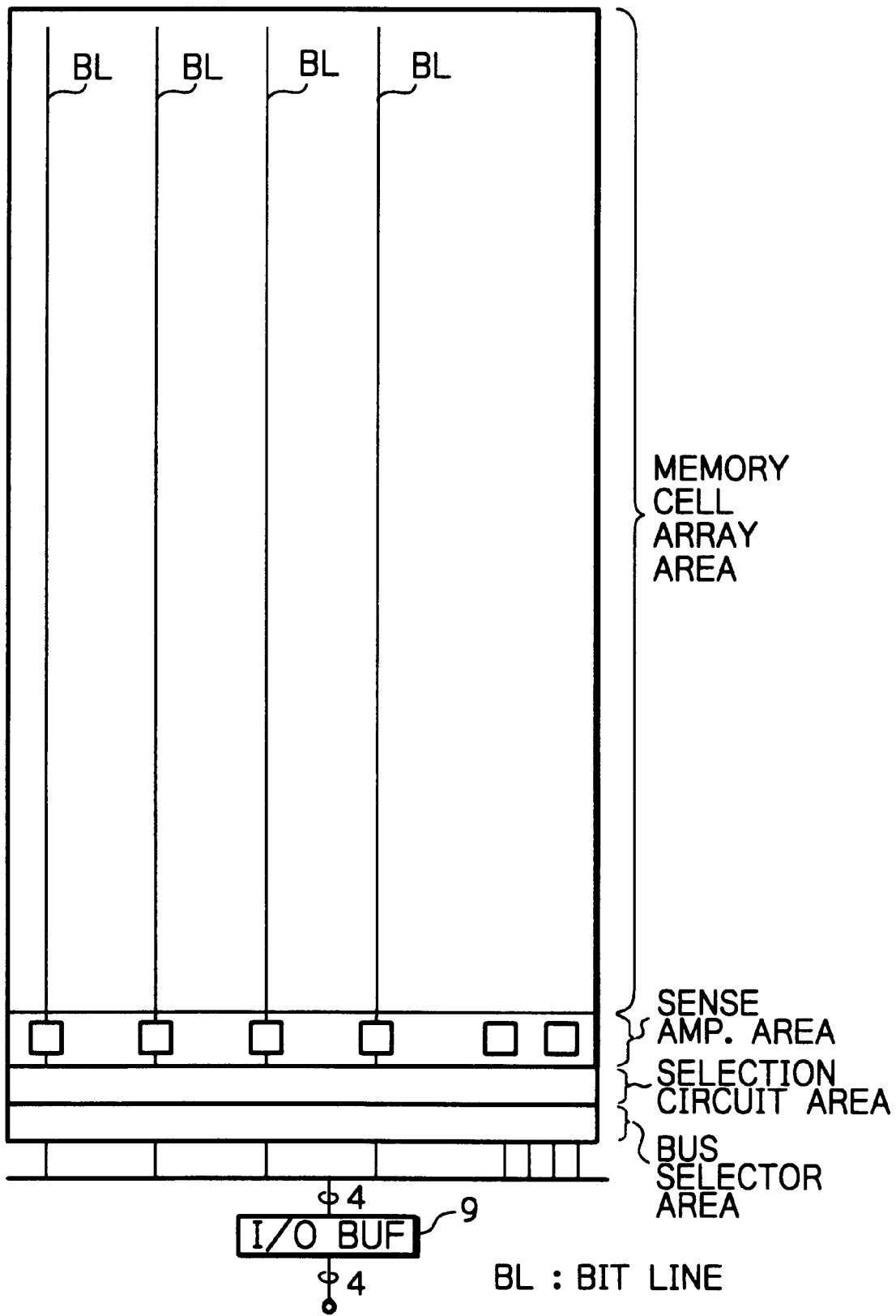

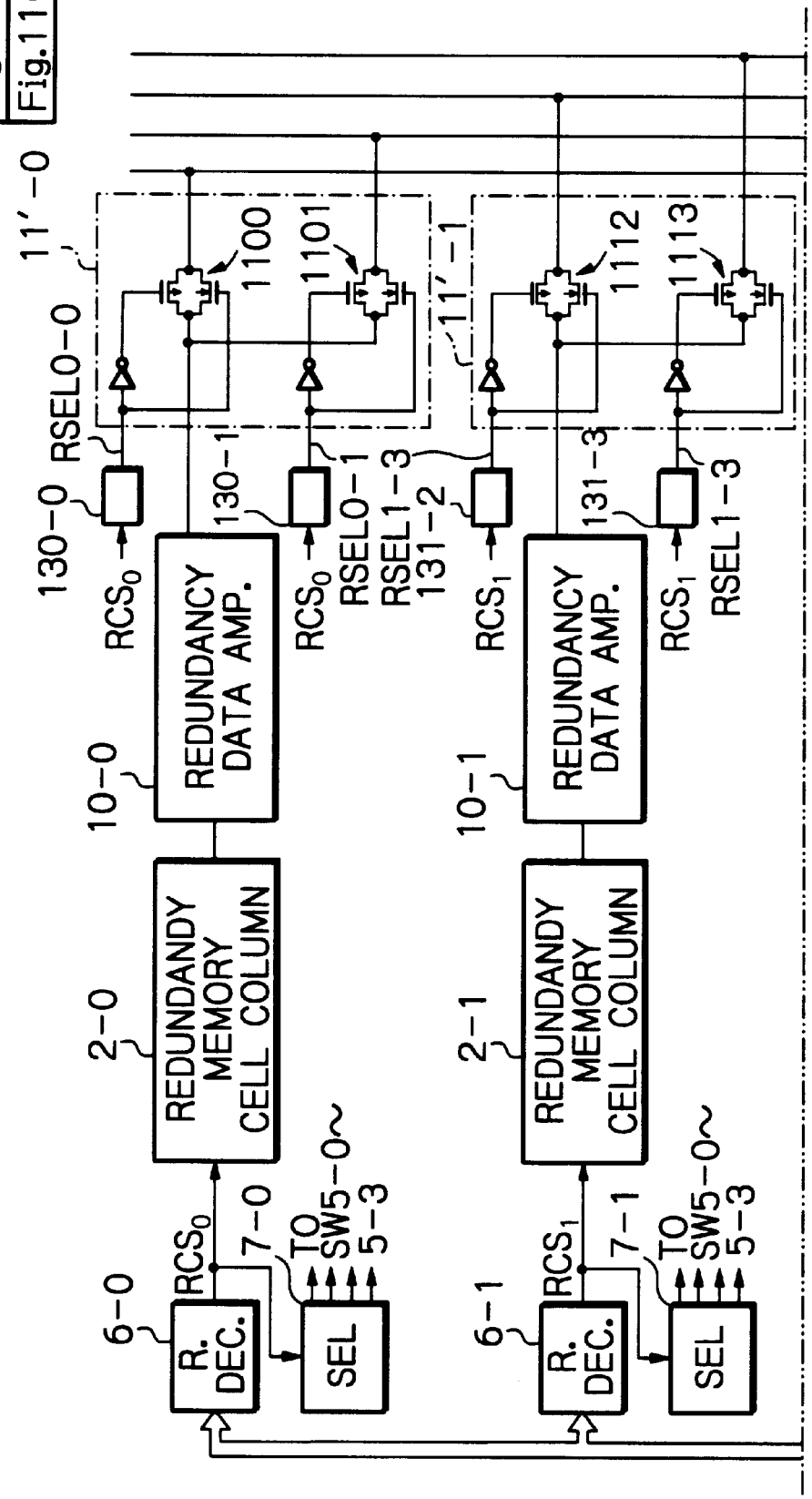

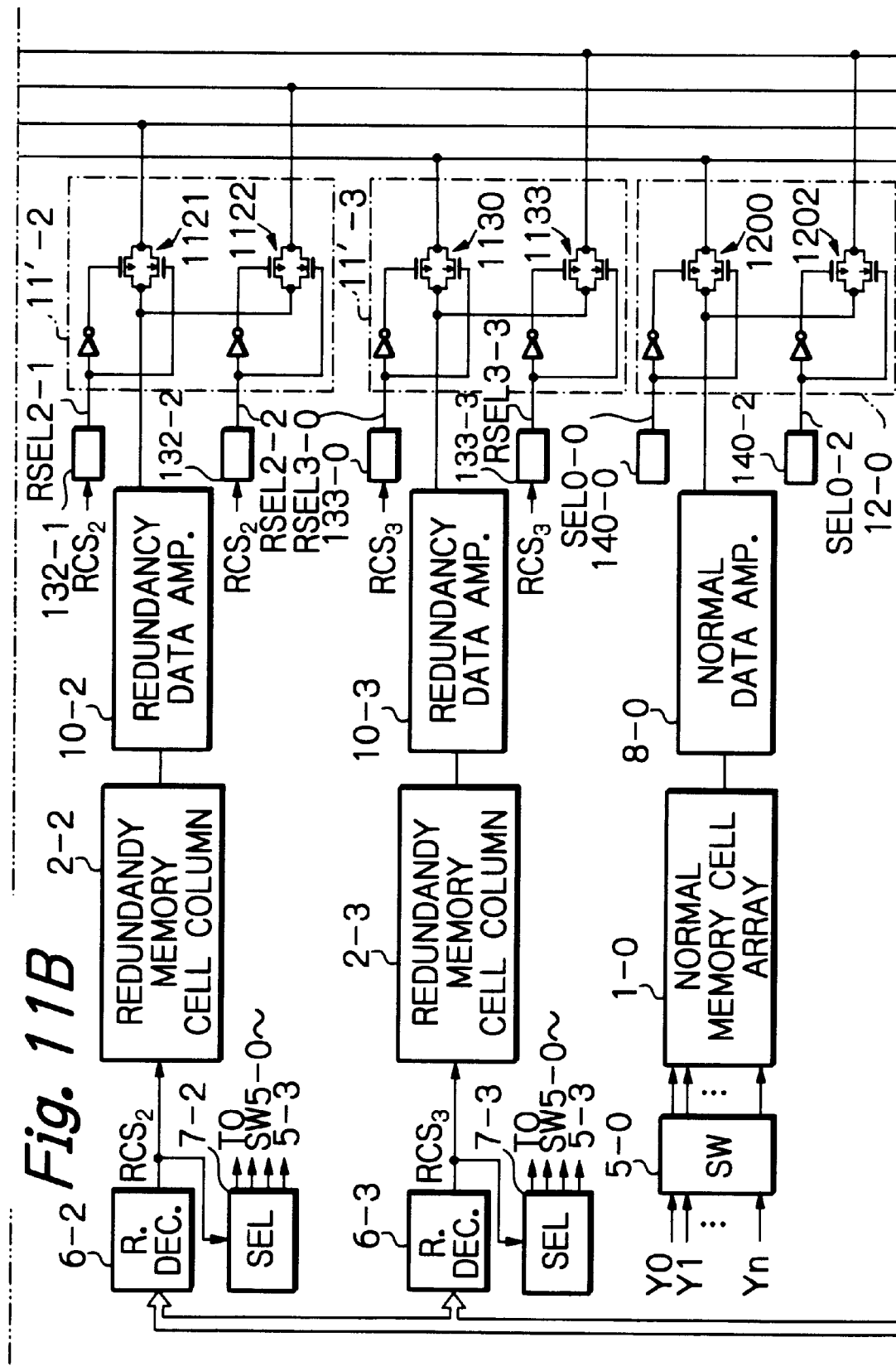

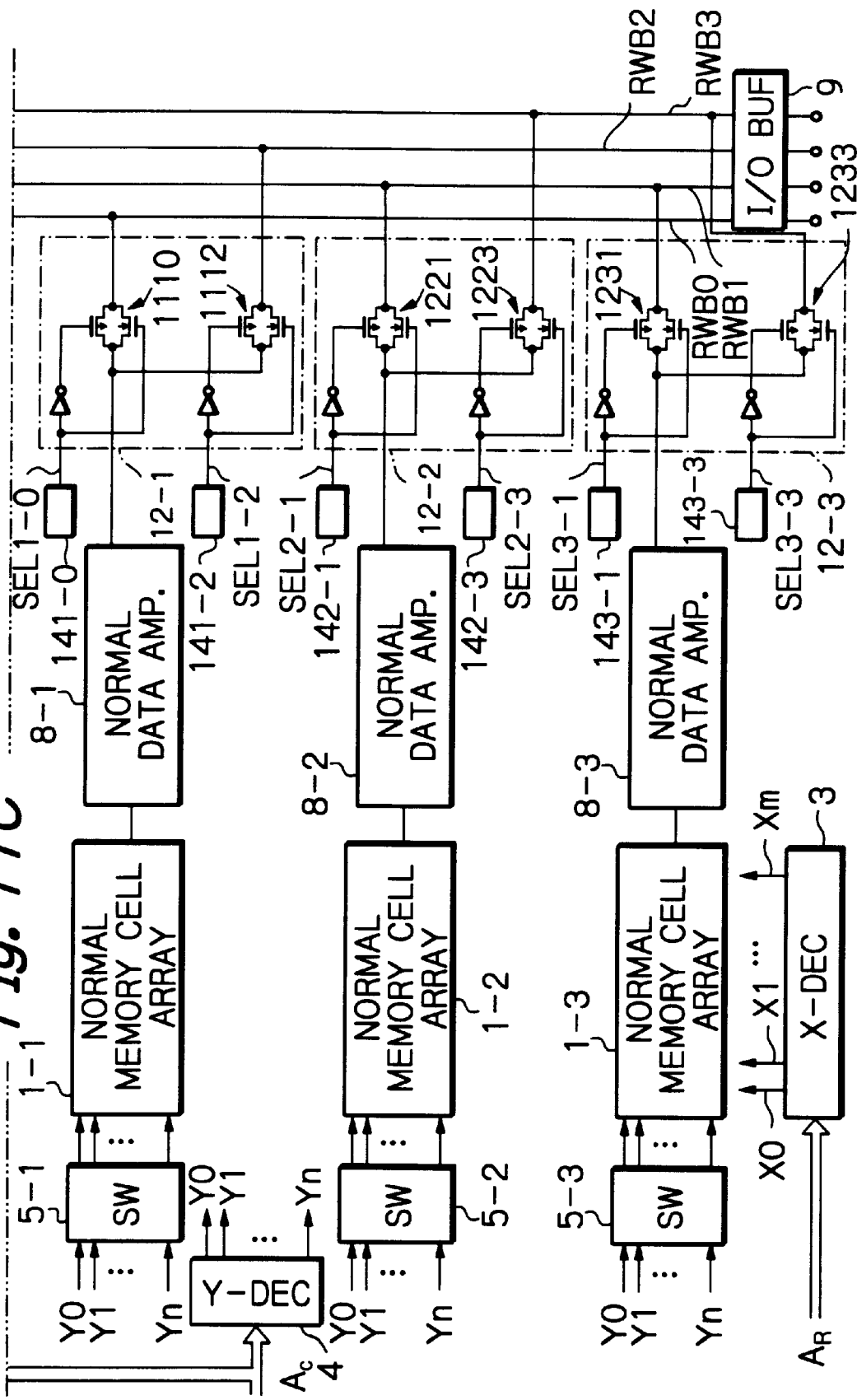

Fig. 12

| MODE | NORMAL MEMORY CELL ARRAY | | | | REDUNDANCY MEMORY CELL COLUMN | | | | SELECTION CIRCUIT | | | | | | | |
|---|---|---|---|---|---|---|---|---|---|---|---|---|---|---|---|---|
| | 1-0 | 1-1 | 1-2 | 1-3 | 2-0 | 2-1 | 2-2 | 2-3 | 7-0 | 7-1 | 7-2 | 7-3 | | | | |
| 1 | RWB 0 | RWB 2 | RWB 1 | RWB 3 | — | — | — | — | — | — | — | — | | | | |
| 2 | RWB 0 | RWB 2 | RWB 1 | RWB 3 | RWB 0 | — | — | — | — | — | — | — | | | | |
| 3 | RWB 0 | RWB 2 | RWB 1 | RWB 3 | — | RWB 2 | — | — | 5-0 | — | — | — | | | | |
| 4 | RWB 0 | RWB 2 | RWB 1 | RWB 3 | RWB 1 | — | — | — | — | 5-1 | — | — | | | | |
| 5 | RWB 0 | RWB 2 | RWB 1 | RWB 3 | — | RWB 3 | — | — | 5-2 | 5-3 | — | — | | | | |
| 6 | RWB 0 | RWB 2 | RWB 1 | RWB 3 | RWB 0 | RWB 2 | — | — | 5-0 | 5-1 | — | — | | | | |
| 7 | RWB 2 | RWB 0 | RWB 1 | RWB 3 | RWB 1 | RWB 2 | — | — | 5-0 | 5-2 | — | — | | | | |
| 8 | RWB 2 | RWB 0 | RWB 1 | RWB 3 | RWB 1 | RWB 3 | — | — | 5-0 | 5-3 | — | — | | | | |
| 9 | RWB 0 | RWB 2 | RWB 1 | RWB 3 | RWB 1 | RWB 2 | — | — | 5-1 | 5-2 | — | — | | | | |
| 10 | RWB 0 | RWB 2 | RWB 1 | RWB 3 | RWB 1 | RWB 3 | — | — | 5-1 | 5-3 | — | — | | | | |
| 11 | RWB 0 | RWB 2 | RWB 1 | RWB 3 | RWB 1 | RWB 3 | — | — | 5-2 | 5-3 | — | — | | | | |
| 12 | RWB 0 | RWB 2 | RWB 1 | RWB 3 | RWB 0 | RWB 2 | RWB 1 | RWB 3 | 5-0 | 5-1 | 5-2 | — | | | | |
| 13 | RWB 0 | RWB 2 | RWB 1 | RWB 3 | RWB 0 | — | RWB 1 | RWB 3 | 5-0 | — | — | 5-3 | | | | |
| 14 | RWB 0 | RWB 2 | RWB 1 | RWB 3 | RWB 0 | — | RWB 1 | RWB 3 | 5-0 | 5-1 | — | 5-3 | | | | |
| 15 | RWB 0 | RWB 2 | RWB 1 | RWB 3 | — | RWB 2 | RWB 1 | RWB 3 | 5-0 | 5-1 | 5-2 | 5-3 | | | | |
| 16 | RWB 0 | RWB 2 | RWB 1 | RWB 3 | RWB 0 | RWB 2 | RWB 1 | RWB 3 | 5-0 | 5-1 | 5-2 | 5-3 | | | | |

☐ MEMORY CELL ARRAY
▨ HAVING DEFECTIVE MEMORY CELL

5,973,970

SEMICONDUCTOR MEMORY DEVICE INCORPORATING REDUNDANCY MEMORY CELLS HAVING UNIFORM LAYOUT

BACKGROUND OF THE INVENTION

1. Field of the Invention

The present invention relates to a semiconductor memory device incorporating redundancy memory cells.

2. Description of the Related Art

In a prior art semiconductor memory device such as a dynamic random access memory (DRAM) device or a static random access memory device (SRAM) device, a plurality of redundancy memory cells are incorporated thereinto. As a result, even if two or more defective memory cells are found, the device can be relieved by replacing such defective memory cells with the redundancy memory cells.

Generally, the prior art semiconductor memory device is constructed by a plurality of bus lines, a plurality of normal memory cell arrays, a plurality of normal data amplifiers for amplifying data read from the normal memory cell arrays, a plurality of redundancy memory cell arrays, a plurality of redundancy data amplifiers for amplifying data read from the redundancy memory cell arrays and a plurality of bus selectors are connected to the redundancy data amplifiers and the bus lines, so as to selectively connect the redundancy data amplifiers to the bus lines. That is, the normal data amplifiers are always directly connected to the respective bus lines. This will be explained later in detail.

In the above-described prior art semiconductor memory device, however, since the large area of the bus selectors is provided only on the side of the redundancy memory cell arrays, the layout is not uniform so that the layout design becomes complex. In addition, since there is no bus selector on the side of the normal memory cell arrays, the speed of the read operation from the normal memory cell arrays is different from the speed of the read operation from the redundancy memory arrays.

SUMMARY OF THE INVENTION

It is an object of the present invention to simplify the layout design of a semiconductor memory device incorporating redundancy memory cells.

Another object is to make the read operation speed of the semiconductor memory device uniform.

According to the present invention, in a semiconductor memory device including a plurality of bus lines, a plurality of normal memory cell arrays, a plurality of normal data amplifiers for amplifying data read from the normal memory cell arrays, a plurality of redundancy memory cell arrays, and a plurality of redundancy data amplifiers for amplifying data read from the redundancy memory cell arrays, a plurality of first bus selectors are connected to the normal data amplifiers and the bus lines, so as to selectively connect the normal data amplifiers to the bus-lines. Also, a plurality of second bus selectors are connected to the redundancy data amplifiers and the bus lines, so as to selectively connect the redundancy data amplifiers to the bus lines.

Thus, the bus selectors are provided for both the normal memory cell arrays and the redundancy memory cell arrays.

BRIEF DESCRIPTION OF THE DRAWINGS

The present invention will be more clearly understood from the description as set below, as compared with the prior art, with reference to the accompanying drawings, wherein:

FIGS. 5A–C are a block circuit diagram illustrating a first embodiment of the semiconductor memory device according to the present invention;

FIG. 9 is a layout diagram of the device of FIG. 5;

FIG. 10 is a layout diagram of a modification of the device of FIG. 5;

FIGS. 11A–C are a block circuit diagram illustrating a second embodiment of the semiconductor memory device according to the present invention; and FIG. 12 is a table showing the operation of the device of FIG. 11.

DESCRIPTION OF THE PREFERRED EMBODIMENTS

Before the description of the preferred embodiments, a prior art semiconductor memory device will be explained with reference to FIGS. 1 through 4.

Figure 1A:
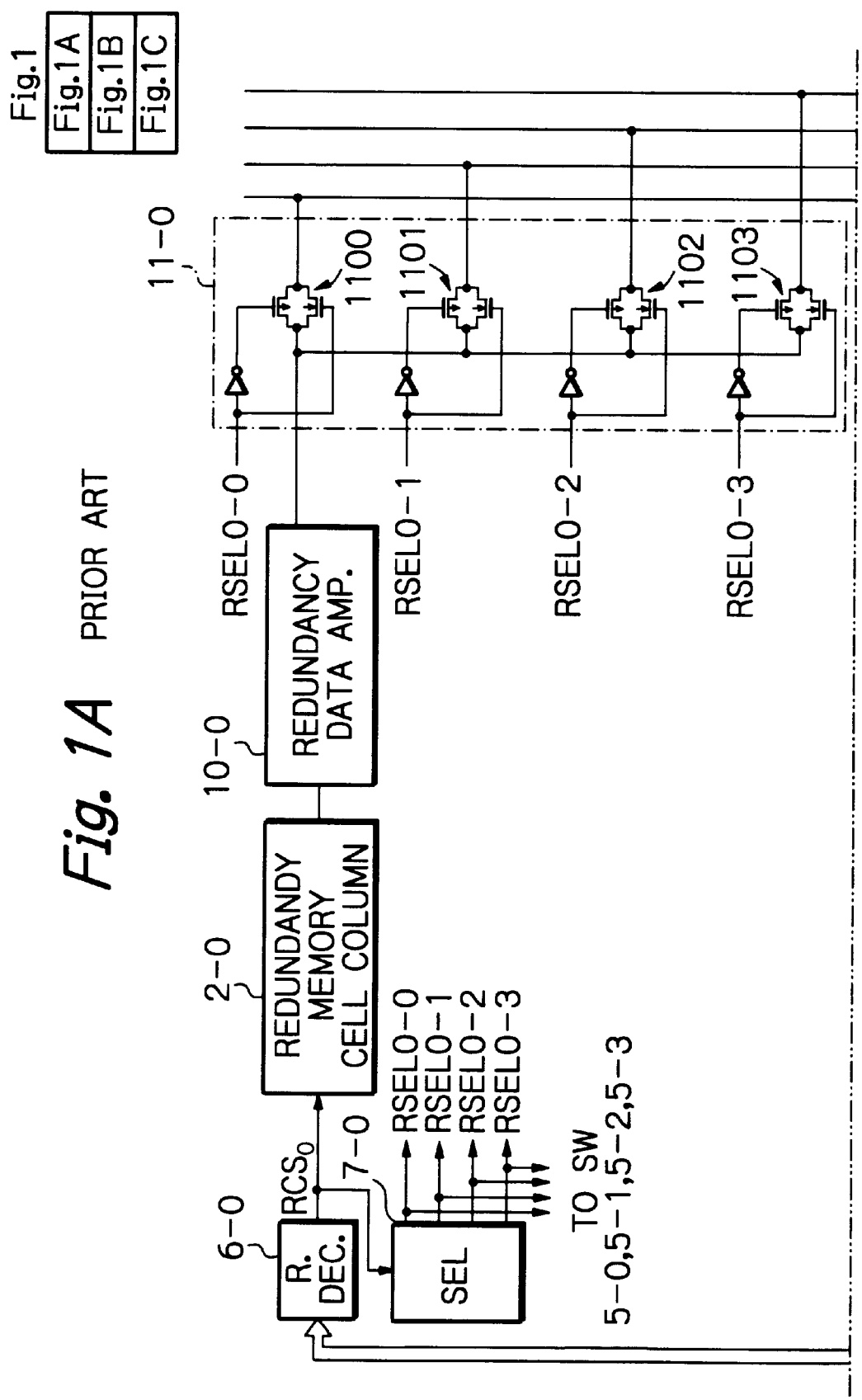
FIGS. 1A–1C are a block circuit diagram illustrating a prior art semiconductor memory device.
Figure 1B:
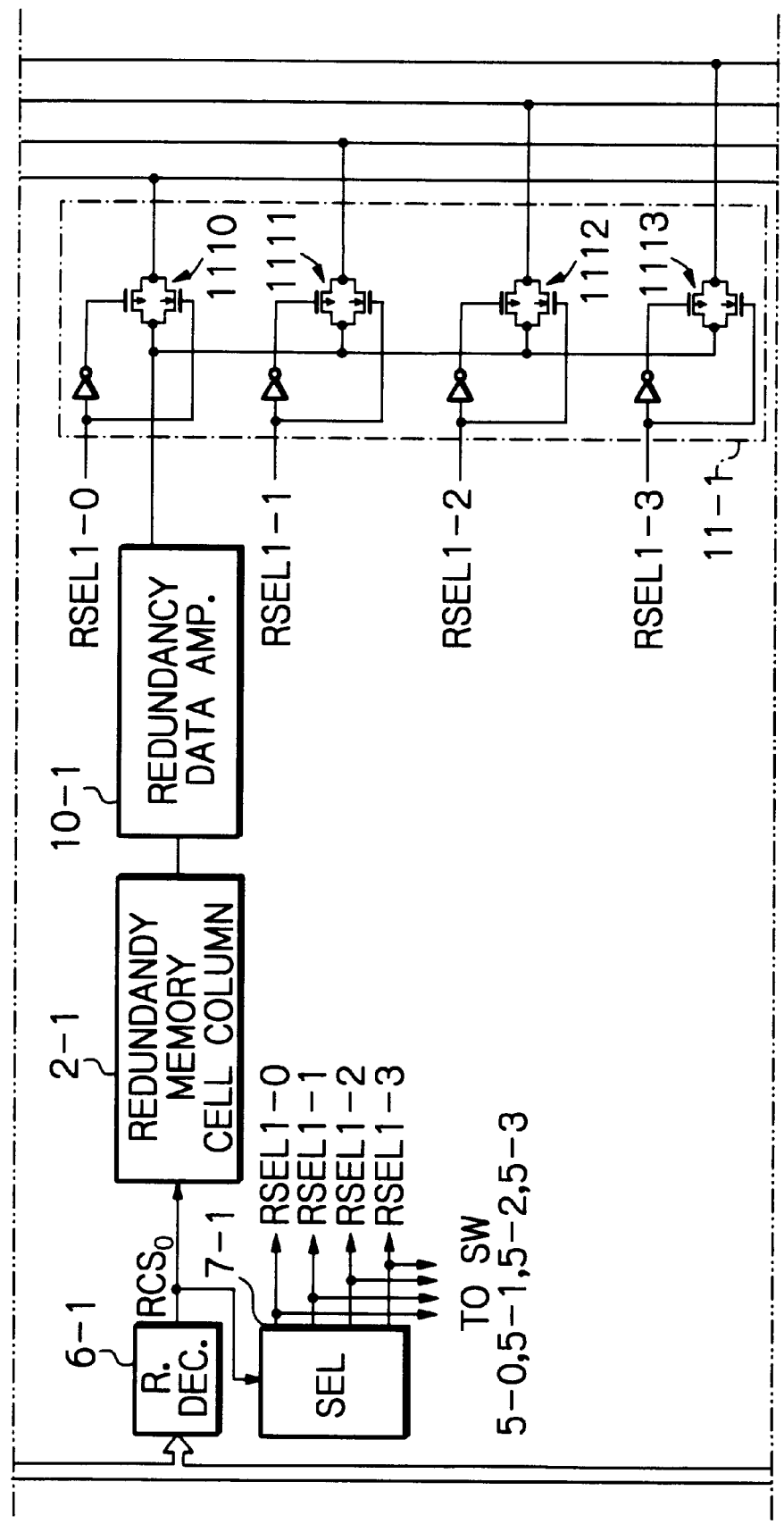
Figure 1C:
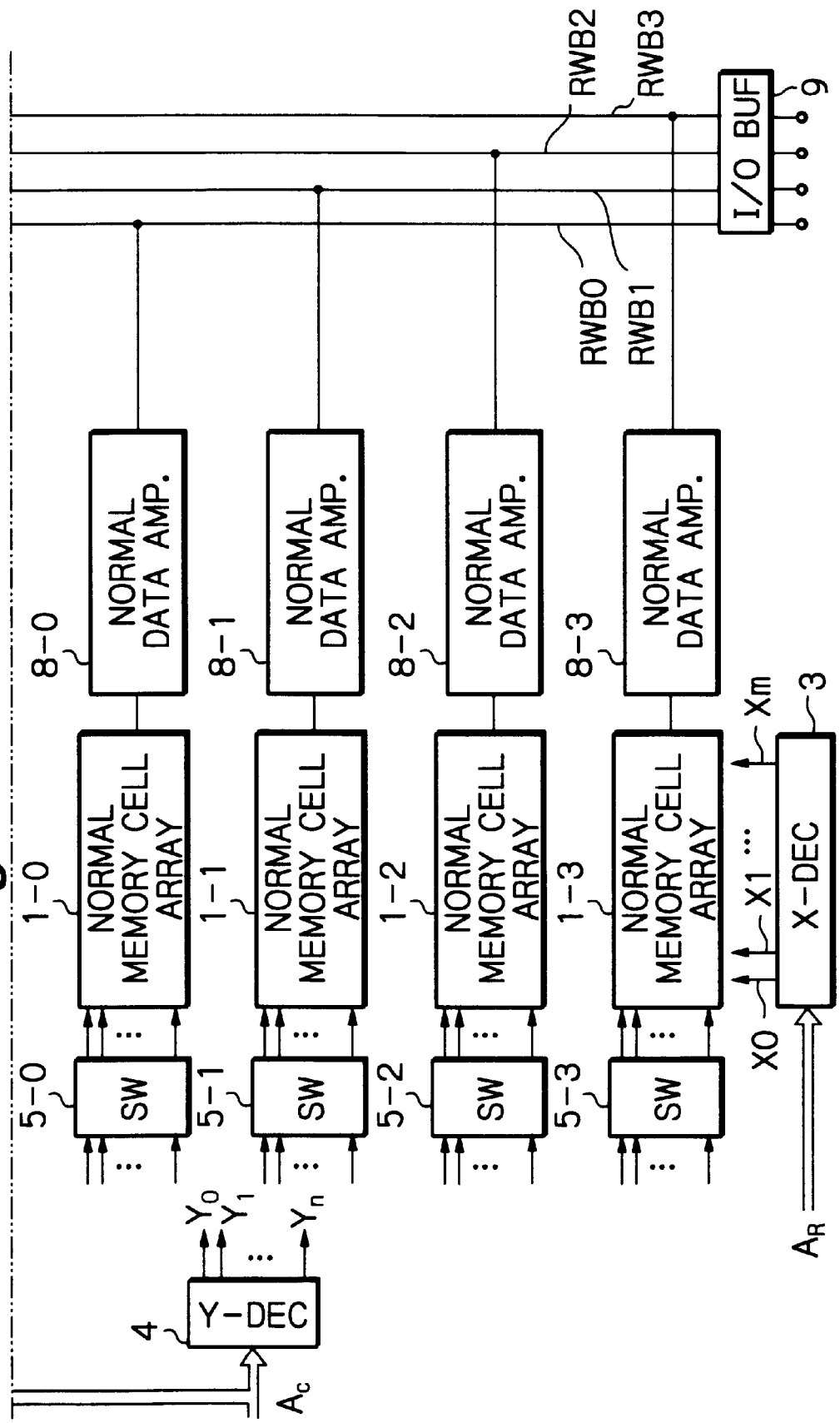

In FIG. 1, which illustrates a prior art four-bit dynamic RAM device, reference numerals 1-0, 1-1, 1-2 and 1-3 designate normal memory cell arrays, and 2-0 and 2-1 designate redundancy memory cell columns.

An X decoder (row decoder) is provided commonly for the normal memory cell arrays 1-0, 1-1, 1-2, and 1-3 and the redundancy memory cell columns 2-0 and 2-1. That is, the X decoder 3 receives a row address signal $A_R$ to generate decoded signals X0, X1, . . . , Xm, so that one of word lines is selected from each of the normal memory cell arrays 1-0, 1-1, 1-2 and 1-3 and the redundancy memory cell columns 2-0 and 2-1.

Also, a Y decoder (column decoder) 4 is provided for the normal memory cell arrays 1-0, 1-1, 1-2 and 1-3. That is, the Y decoder 4 receives a column address signal $A_C$ to generate decoded signals Y0, Y1, . . . , Yn, so that one of bit lines is selected from each of the normal memory cell arrays 1-0, 1-1, 1-2 and 1-3. In this case, switch circuits 5-0, 5-1, 5-2 and 5-3 are interposed between the Y decoder 4 and the normal memory cell arrays 1-0, 1-1, 1-2 and 1-3, and therefore, the transmission of the decoded signals Y0, Y1, . . . , Yn to the normal memory cell arrays 1-0, 1-1, 1-2 and 1-3 are turned ON and OFF by the switch circuits 5-0, 5-1, 5-2 and 5-3, respectively, which are controlled by redundancy column decoders 6-0 and 6-1.

Figure 2:
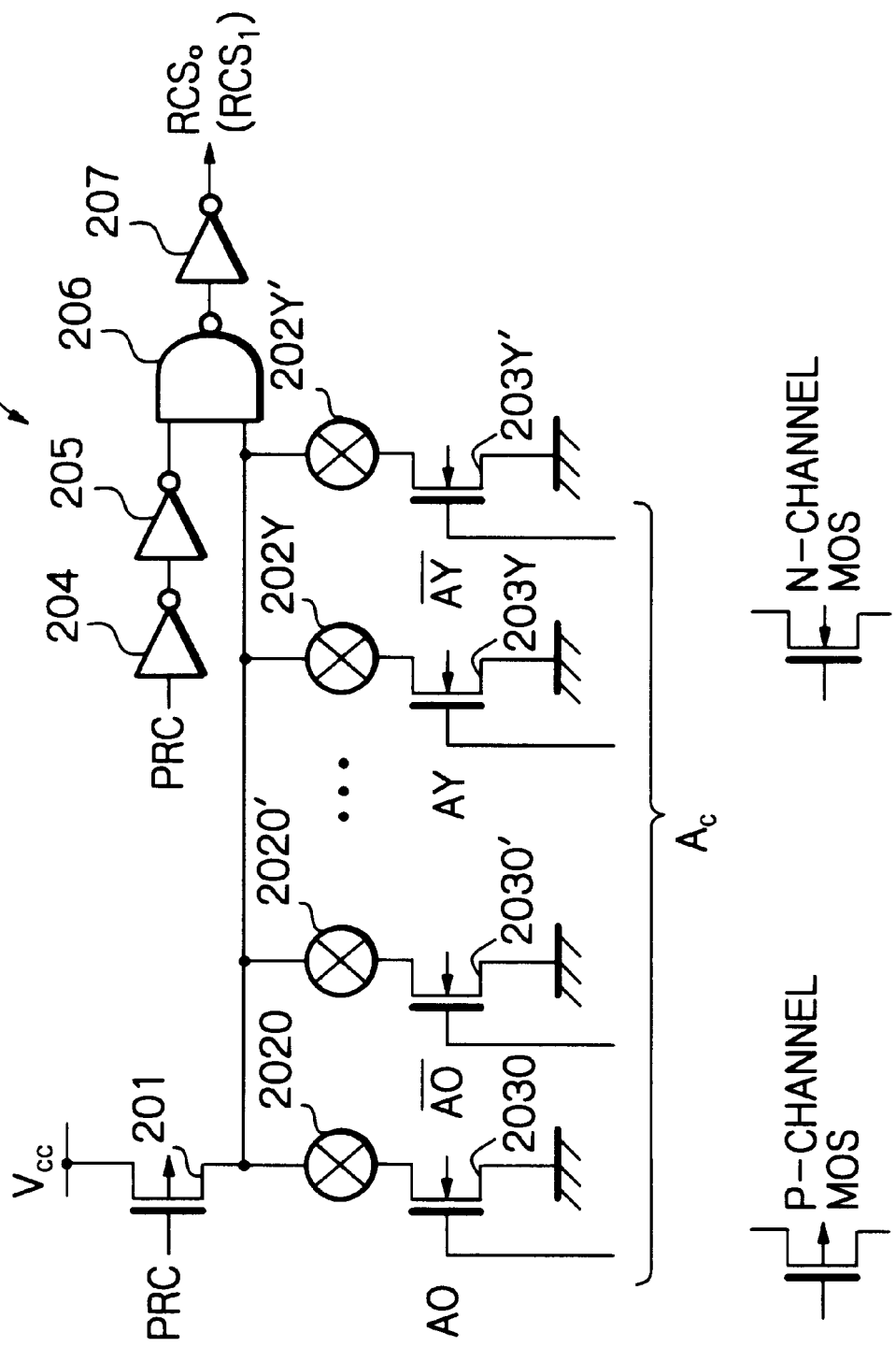
FIG. 2 is a detailed circuit diagram of the redundancy column decoder of FIG. 1.

The redundancy column decoders 6-0 and 6-1 are used for selecting the redundancy memory cell columns 2-0 and 2-1, respectively. Each of the redundancy column decoders 6-0 and 6-1 is constructed by a fuse-type NOR-type read only memory (PROM). For example, as illustrated in FIG. 2, the redundancy column decoder 6-0 (6-1) includes a precharging P-channel MOS transistor 201, fuses 202O, 202O', . . . , 202Y, 202Y', N-channel MOS transistors 203O, 203O', . . . , 203Y, 203Y', inverters 204 and 205, a NAND circuit 206 and an inverter 207. In this case, the transistors 203O, 203O', . . . , 203Y, and 203Y' are controlled by bits A0, $\overline{A0}$, . . . , AY, $\overline{AY}$, respectively, of the column address signal $A_C$. When the redundancy column decoder 6-0 or 6-1 generates a redundancy column selection signal $RCS_0$, or $RCS_1$, to select the redundancy memory cell column 2-0 or 2-1, the redundancy column selection signal $RCS_0$ or $RCS_1$ is supplied to a selection circuit 7-0 or 7-1 to disable one of the switch circuits 5-0, 5-1, 5-2 and 5-3. The selection circuits 7-0 and 7-1 will be discussed later in detail.

For example, when a defective memory cell is found in the memory cell array 1-0, the fuses 2020, 2020', ..., 202Y and 202Y' of the redundancy column decoder 6-0 are trimmed by a laser, so that a defective column address indicating this defective memory cell is written into the redundancy column decoder 6-0. Simultaneously, one fuse of the selection circuit 7-0 is trimmed by a laser, so that the selection circuit 7-0 can be operated to disable the switch circuit 5-0.

In addition, when another defective memory cell is found in the memory cell array 1-1, the fuses 2020, 2020', ..., 202Y and 202Y' of the redundancy column decoder 6-1 are trimmed by a laser, so that a defective column address indicating this defective memory cell is written into the redundancy column decoder 6-1. Simultaneously, one fuse of the selection circuit 7-1 is trimmed by a laser, so that the selection circuit 7-1 can be operated to disable the switch circuit 5-1.

Also, connected to the normal memory cell arrays 1-0, 1-1, 1-2 and 1-3 are normal data amplifiers 8-0, 8-1, 8-2 and 8-3, respectively, which are further connected to read/write bus lines RWB0, RWB1, RWB2 and RWB3, respectively. Thus, data read from the normal memory cell arrays 1-0, 1-1, 1-2 and 1-3 are amplified by the normal data amplifiers 8-0, 8-1, 8-2 and 8-3, respectively, and are transmitted to the read/write bus lines RWB0, RWB1, RWB2 and RWB3 which is further connected to an input/output buffer 9.

On the other hand, connected to the normal memory cell arrays 2-0 and 2-1, are redundancy data amplifiers 10-0 and 10-1, respectively, which are further selectively connected to the read/write bus lines RWB0, RWB1, RWB2 and RWB3, via bus selectors 11-0 and 11-1. Thus, data readfrom the redundancy memory cell arrays 2-0 and 2-1 are amplified by the redundancy data amplifiers 10-0 and 10-1, respectively, and are transmitted to the selected ones of the read/write bus lines RWB0, RWB1, RWB2 and RWB3.

The bus selector 11-0 is formed by four CMOS switches 1100, 1101, 1102 and 1103 connected between the redundancy data amplifier 10-0 and the read/write bus lines RWB0, RWB1, RWB2 and RWB3. Similarly, the bus selector 11-1 is formed by four CMOS switches 1110, 1111, 1112 and 1113 connected between the redundancy data amplifier 10-1 and the read/write bus lines RWB0, RWB1, RWB2 and RWB3.

The CMOS switches 1100, 1101, 1102 and 1103 of the bus selector 11-0 are controlled by selection signals RSEL0-0, RSEL0-1, RSEL0-2 and RSEL0-3 which are also generated from the selection circuit 7-0. Similarly, the CMOS switches 1110, 1111, 1112 and 1113 of the bus selector 11-1 are controlled by selection signals RSEL1-0, RSEL1-1, RSEL1-2 and RSEL1-3 which are also generated from the selection circuit 7-1.

Figure 3:
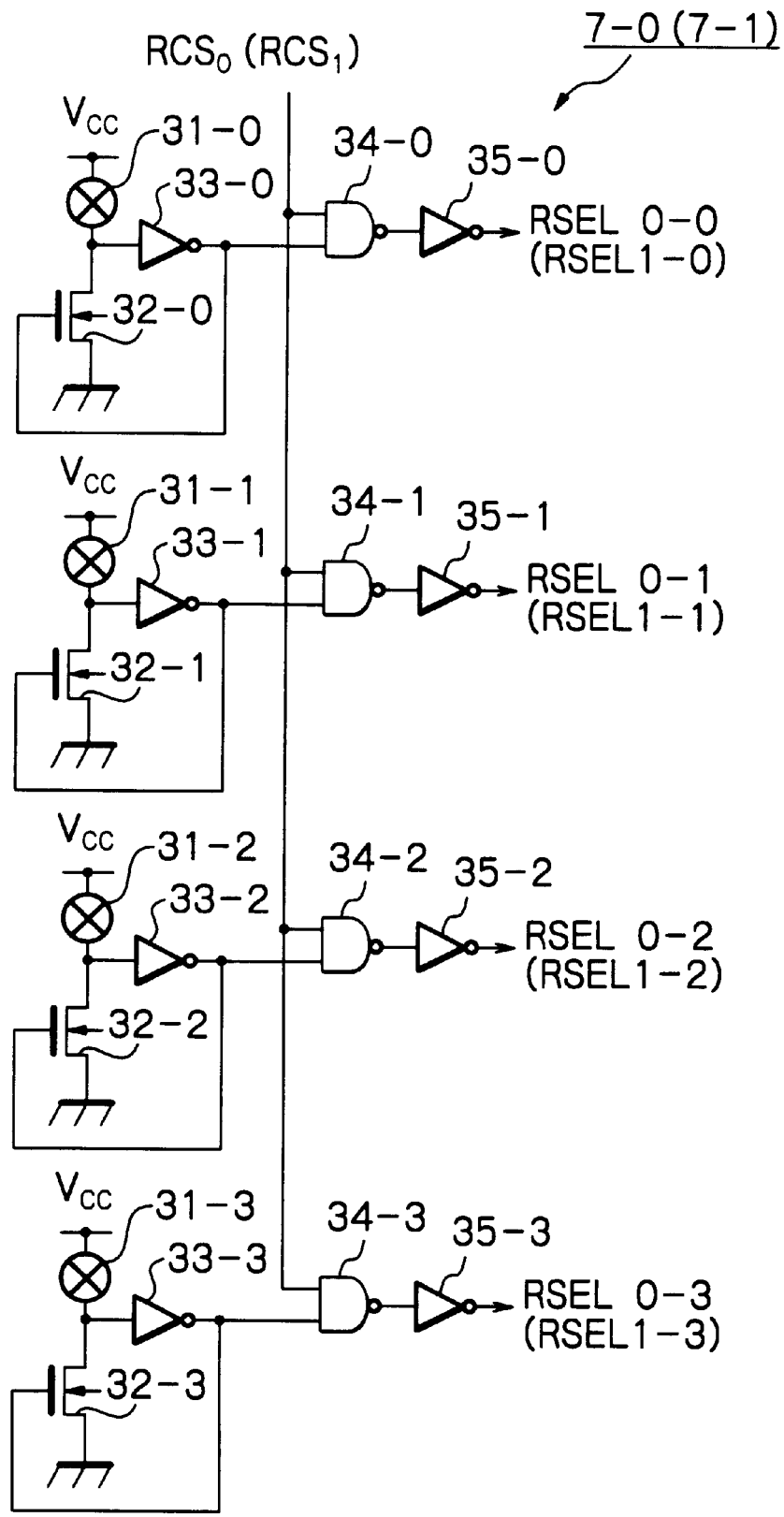
FIG. 3 is a detailed circuit diagram of the selection circuit of FIG. 1.

As illustrated in FIG. 3, the selection circuit 7-0 (7-1) is formed by fuses 31-0, 31-1, 31-2 and 31-3, N-channel MOS transistors 32-0, 32-1, 32-2 and 32-3, inverters 33-0, 33-1, 33-2 and 33-3, NAND circuits 34-0, 34-1, 34-2 and 34-3, and inverters 35-0, 35-1, 35-2 and 35-3. In this case, the NAND circuits 34-0, 34-1, 34-2 and 34-3 receive the redundancy column selection signal $RCS_0$ ($RCS_1$).

Therefore, when a defective memory cell is found in the memory cell array 1-0, the fuse 31-0 of the selection circuit 7-0 is trimmed by a laser. In addition, when another defective memory cell is found in the memory cell array 1-1, the fuse 31-1 of the selector 7-1 is trimmed by a laser. In this case, when a column address signal $A_C$ indicating one of the defective memory cells is supplied to the Y decoder 4, the normal memory cell array 1-0 or 1-1 is not selected and the redundancy memory cell column 2-0 or 2-1 is accessed by the redundancy column decoder 6-0 or 6-1, so that data read from the redundancy memory cell column 2-0 or 2-1 is amplified by the redundancy data amplifier 10-0 or 10-1 and output via the bus selector 11-0 or 11-1 to the read/write bus Line RWB0 or RWB1. Thus, the defective memory cell is relieved.

Figure 4:
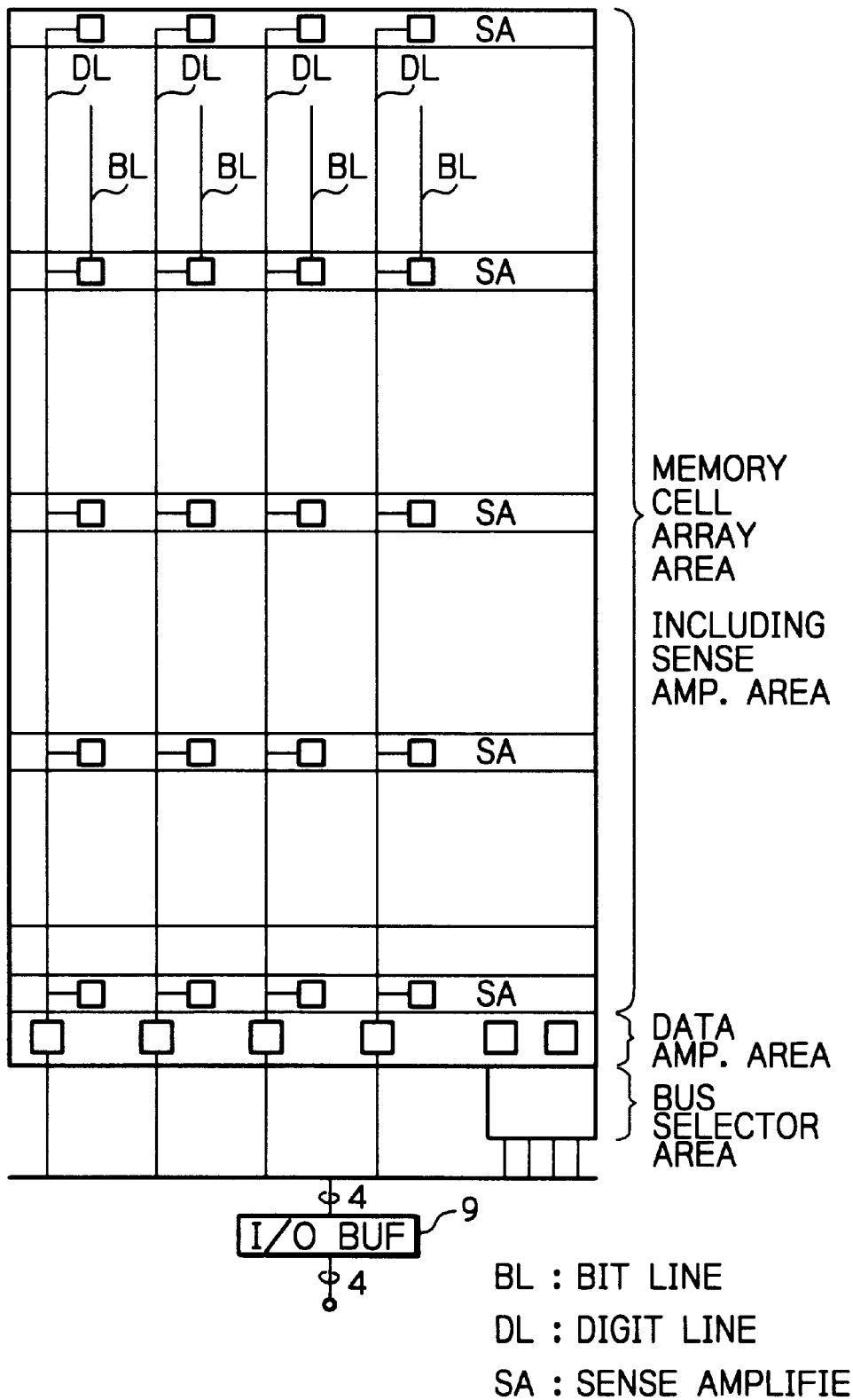
FIG. 4 is a layout diagram of the device of FIG. 1.

In FIG. 4, which is a layout diagram of the device of FIG. 1, a large area for the bus selectors 11-0 and 11-1 is provided only on the side of the redundancy memory columns, that is, the layout is not uniform, which makes the layout design complex. In addition, the speed of the read operation from the normal memory cell arrays 1-0, 1-1, 1-2 and 1-3 is different from the speed of the read operation from the redundancy memory cell columns 2-0 and 2-1.

Figure 5B:
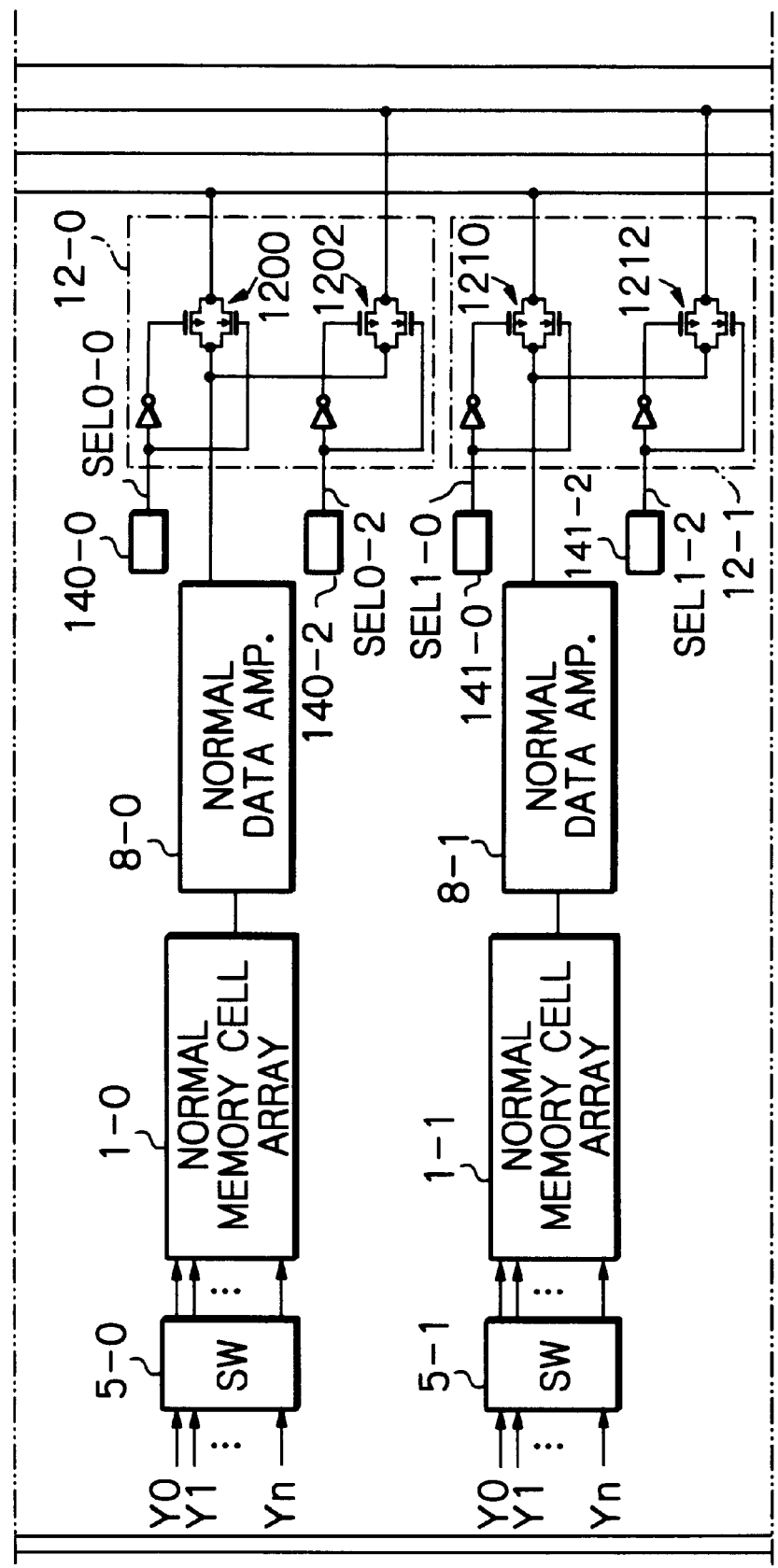
Figure 5C:
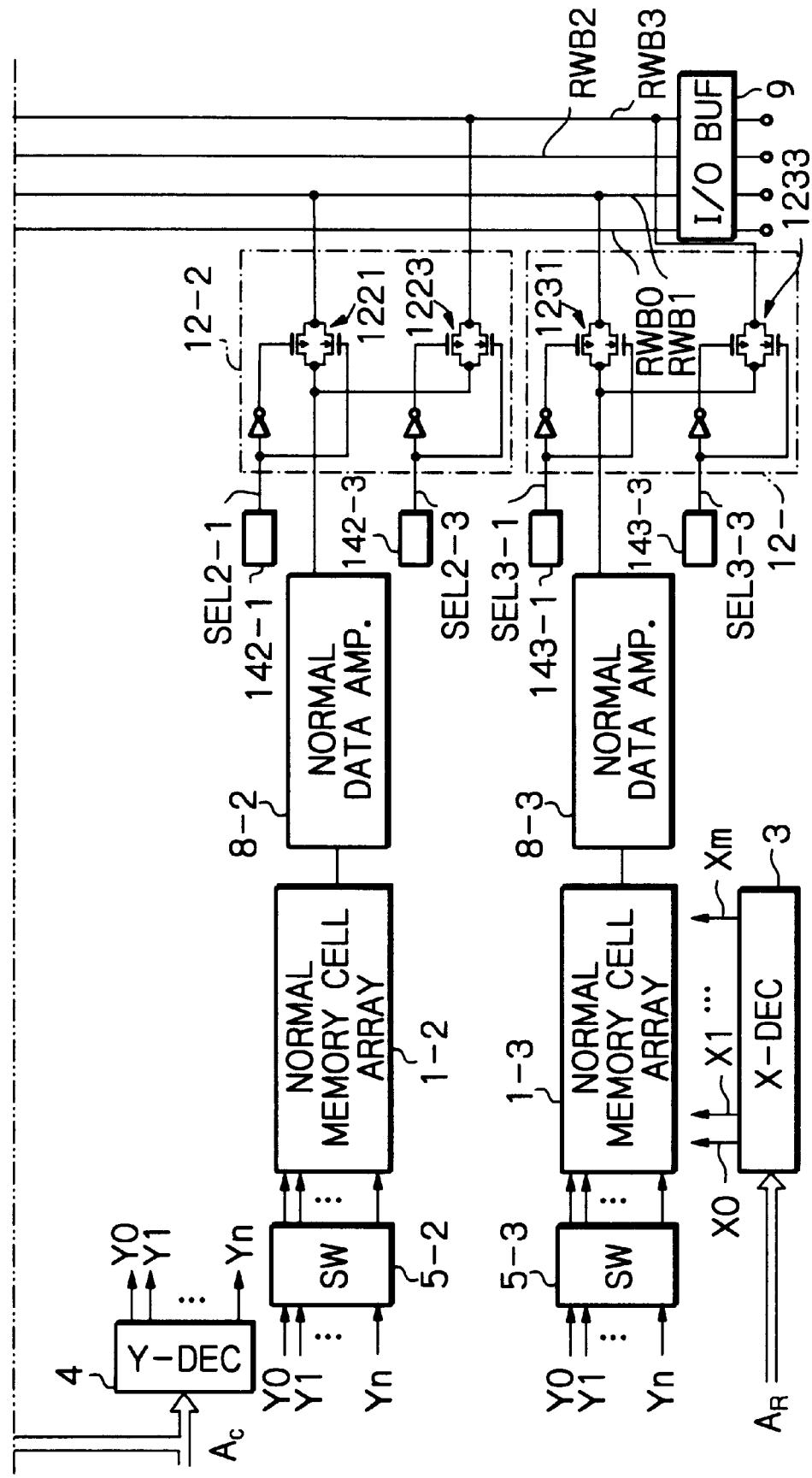

In FIG. 5, which illustrates a first embodiment of the present invention, the bus selector 11-0 and 11-1 of FIG. 1 are modified to bus selectors 11'-0 and 11'-1, respectively. That is, the redundancy data amplifier 10-0 is selectively connected via the bus selector 11'-0 to the read/write bus lines RWB0 and RWB1. Similarly, the redundancy data amplifier 10-1 is selectively connected via the bus selector 1l'-1 to the read/write bus lines RWB2 and RWB3.

Also, bus selectors 12-0, 12-1, 12-2 and 12-3 are connected between the normal data amplifiers 8-0, 8-1, 8-2 and 8-3 and the read/write bus lines RWB0, RWB1, RWB2 and RWB3. More particularly, the bus selector 12-0 is connected between the normal data amplifier 8-0 and the read/write bus lines RWB0 and RWB2, and the bus selector 12-1 is connected between the normal data amplifier 8-1 and the read/write bus lines RWB0 and RWB2. Similarly, the bus selector 12-2 is connected between the normal data amplifier 8-2 and the read/write bus lines RWB1 and RWB3, and the bus selector 12-3 is connected between the normal data amplifier 8-3 and the read/write bus lines RWB1 and RWB3.

The bus selector 11'-0 is formed by two CMOS switches 1100 and 1101 connected between the redundancy data amplifier 10-0 and the read/write bus lines RWB0 and RWB1. Similarly, the bus selector 11'-1 is formed by two CMOS switches 1112 and 1113 connected between the redundancy data amplifier 10-1 and the read/write bus lines RWB2 and RWB3.

The CMOS switches 1100 and 1101 of the bus selector 11'-0 are controlled by selection signals RSEL0-0 and RSEL0-1 which are generated from selection circuits 130-0 and 130-1. Similarly, the CMOS switches 1112 and 1113 of the bus selector 11'-1 are controlled by selection signals RSEL1-2 and RSEL1-3 which are generated from selection circuits 131-2 and 131-3.

Figure 6B:
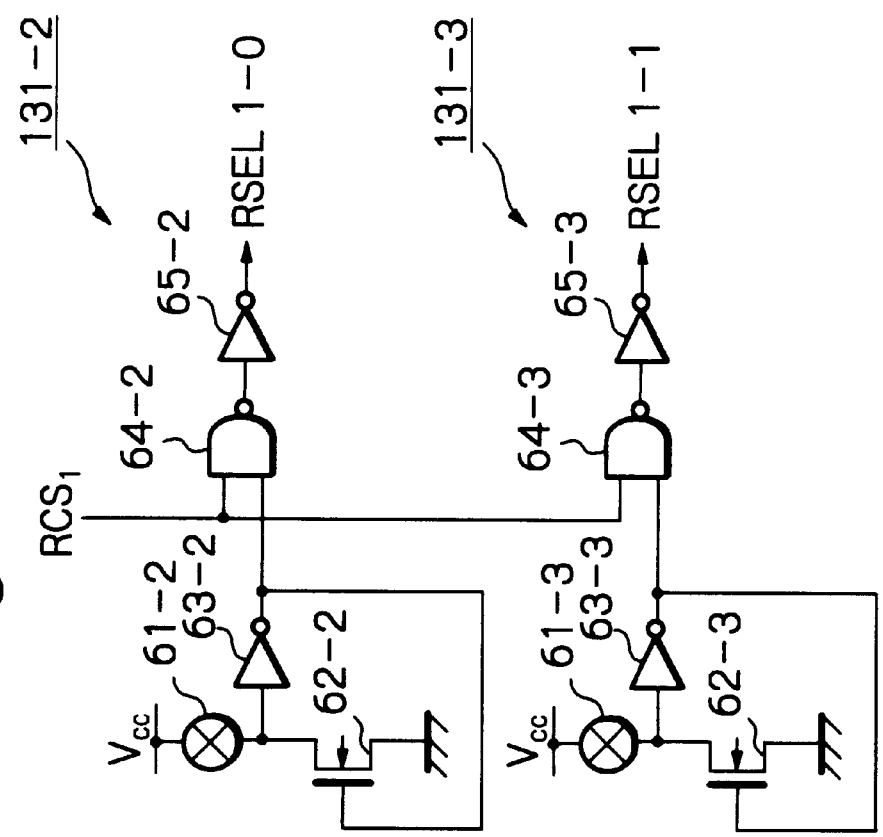
FIGS. 6A, 6B, 7A, 7B, 7C and 7D are detailed circuit diagrams of the selection circuits of FIG. 5.
Figure 6A:
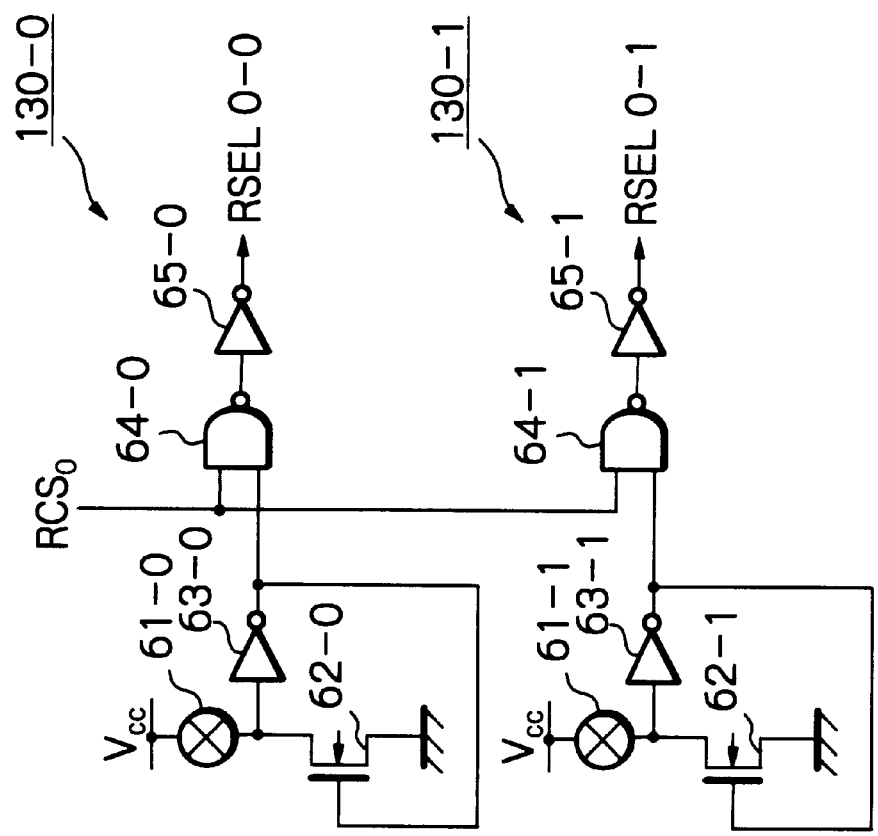

As illustrated in FIG. 6A, the selection circuits 130-0 and 130-1 are formed by fuses 61-0 and 61-1, N-channel MOS transistors 62-0 and 62-1, inverters 63-0 and 63-1, NAND circuits 64-0 and 64-1, and inverters 65-0 and 65-1. In this case, the NAND circuits 64-0 and 64-1 receive the redundancy column selection signal $RCS_0$. Similarly, as illustrated in FIG. 6B, the selection circuits 131-2 and 131-3 are formed by fuses 61-2 and 61-3, N-channel MOS transistors 62-2 and, 62-3, inverters 63-2 and 63-3, NAND circuits 64-2 and 64-3, and inverters 65-2 and , 65-3. In this case, the NAND circuits 64-2 and 64-3 receive the redundancy column selection signal $RCS_1$.

Returning to FIG. 5, the bus selector 12-0 is formed by two CMOS switches 1200 and 1202 connected between the normal data amplifier 8-0 and the read/write bus lines RWB0 and RWB2. Also, the bus selector 12-1 is formed by two CMOS switches 1210 and 1212 connected between the normal data amplifier 8-1 and the read/write bus lines RWB0 and RWB2. Similarly, the bus selector 12-2 is formed by two CMOS switches 1221 and 1223 connected between the normal data amplifier 8-2 and the read/write bus lines RWB1 and RWB3. Also, the selector 12-3 is formed by two CMOS switches 1231 and 1233 connected between the normal data amplifier 8-3 and the read/write bus lines RWB1 and RWB3.

The CMOS switches 1200 and 1201 of the bus selector 12-0 are controlled by selection signals SEL0-0 and SEL0-2 which are generated from selection circuits 140-0 and 140-2. Also, the CMOS switches 1210 and 1211 of the bus selector 12-1 are controlled by selection signals SEL1-0 and SEL1-2 which are generated from selection circuits 141-0 and 141-2. Similarly, the CMOS switches 1221 and 1223 of the bus selector 12-2 are controlled by selection signals SEL2-1 and SEL2-3 which are generated from selection circuits 142-1 and 142-3. Also, the CMOS switches 1231 and 1233 of the bus selector 12-3 are controlled by selection signals SEL3-1 and SEL3-3 which are generated from selection circuits 143-2 and 143-3.

Figure 7B:
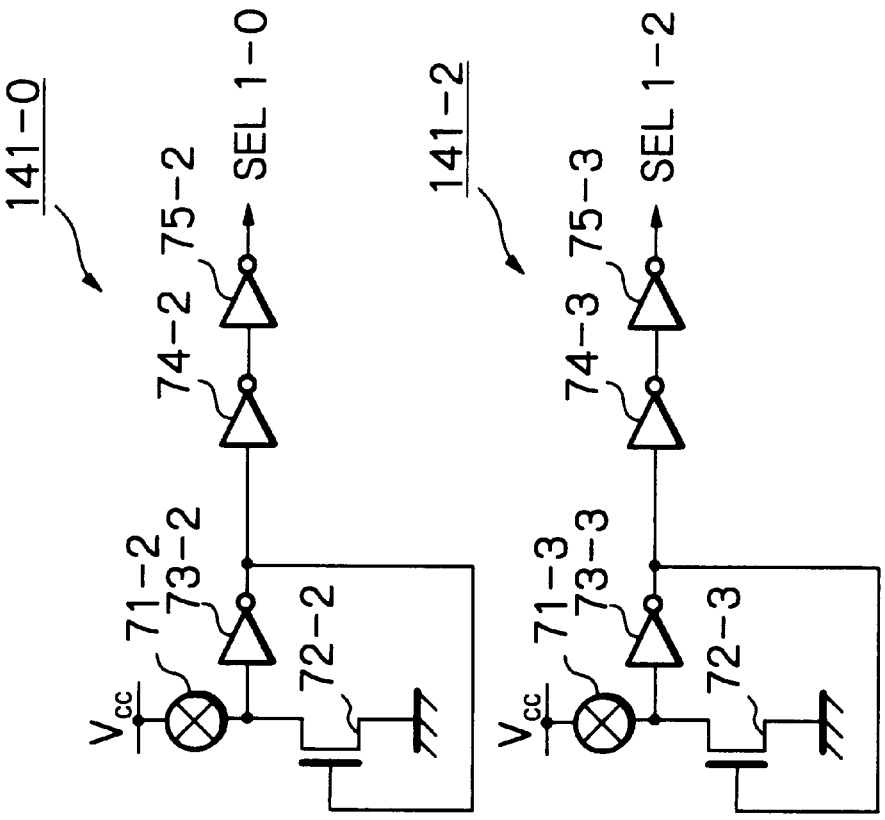
Figure 7A:
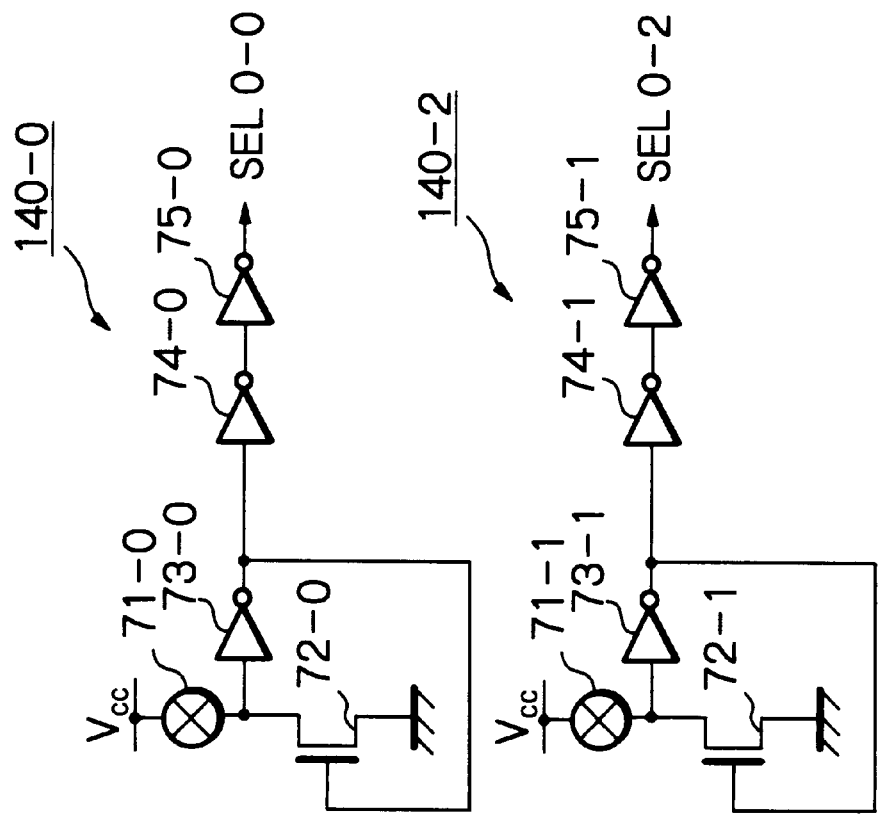
Figure 7D:
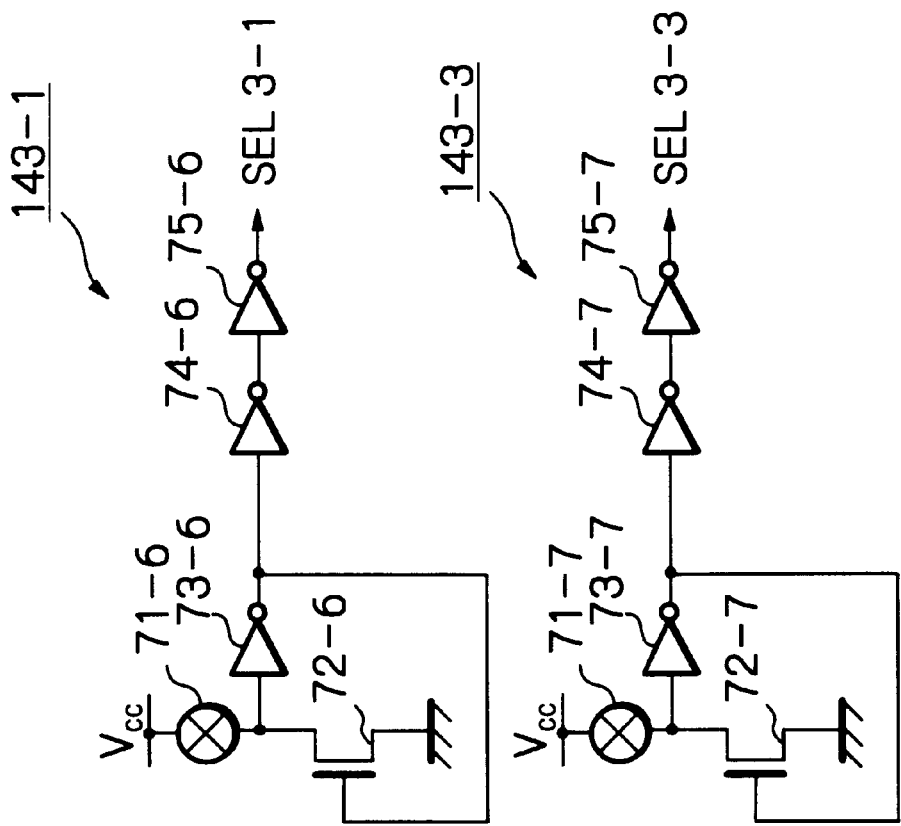
Figure 7C:
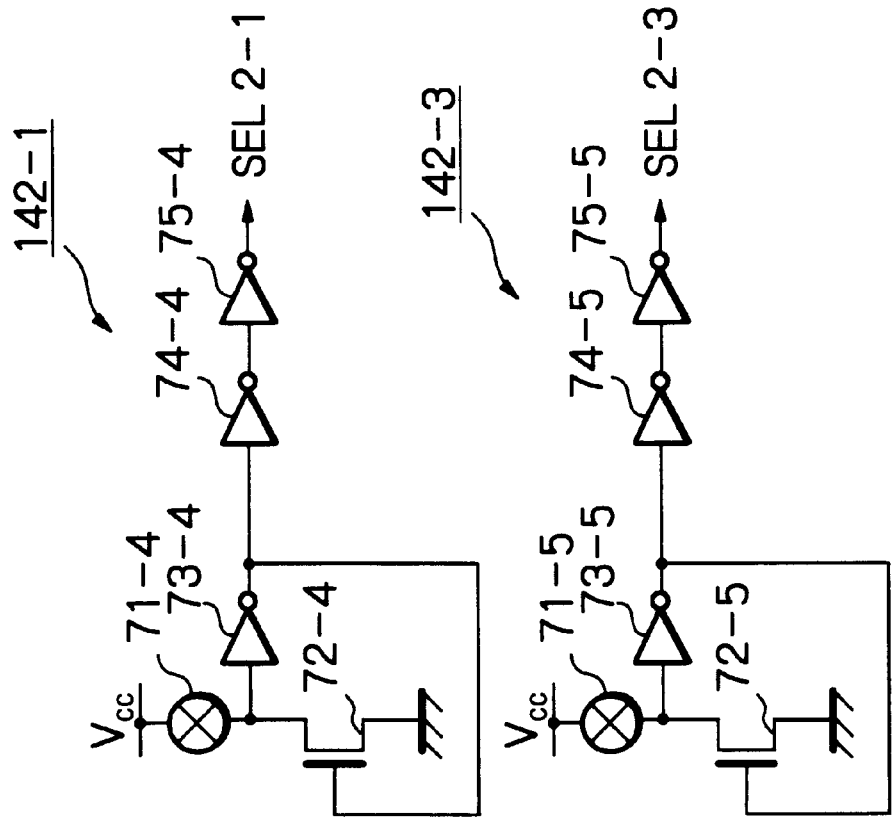

As illustrated in FIG. 7A, the selection circuits 140-0 and 140-2 are formed by fuses 71-0 and 71-1, N-channel MOS transistors 72-0 and 72-1, inverters 73-0 and 73-1, and inverters 74-0, 74-1, 75-0 and 75-1. Also, as illustrated in FIG. 7B, the selection circuits 141-0 and 141-2 are formed by fuses 71-2 and 71-3, N-channel MOS transistors 72-2 and 72-3, inverters 73-2 and 73-3, and inverters 74-2, 74-3, 75-2 and 75-3. Further, as illustrated in FIG. 7C, the selection circuits 142-1 and 142-3 are formed by fuses 71-4 and 71-5, N-channel MOS transistors 72-4 and 72-5, inverters 73-4 and 73-5, and inverters 74-4, 74-5, 75-4 and 75-5. Further, as illustrated in FIG. 7D, the selection circuits 143-1 and 143-3 are formed by fuses 71-6 and 71-7, N-channel MOS transistors 72-6 and 72-7, inverters 73-6 and 73-7, and inverters 74-6, 74-7, 75-6 and 75-7.

Note that the selection circuits 7-0 and 7-1 are used only for controlling the switch circuits 5-0, 5-1, 5-2 and 5-3.

Figure 8:
FIG. 8 is a table showing the operation of the device of FIG. 5.

The operation of the device of FIG. 5 is shown in the table of FIG. 8.

For example, in mode "1" of FIG. 8, when no defective memory cell is found in the normal memory cell arrays 1-0, 1-1, 1-2 and 1-3, no fuse is trimmed in the redundancy column decoders 6-0 and 6-1, the selection circuits 7-0, 7-1, 130-0, 130-1, 131-2 and 131-3. As a result, the switch circuits 5-0, 5-1, 5-2 and 5-3 are never disabled, and the redundancy memory data amplifiers 10-0 and 10-1 are never connected to the read/write bus lines RWB0, RWB1, RWB2 and RWB3. On the other hand, the fuses 71-0, 71-3, 71-4 and 71-7 of the selection circuits 140-0, 141-2, 142-1 and 143-3 are trimmed by a laser. As a result, the normal data amplifiers 8-0, 8-1, 8-2 and 8-3 are always connected to the read/write bus lines RWB0, RWB2, RWB1 and RWB3, respectively. Thus, when a row address signal $A_R$ and a column address signal $A_C$ are supplied to the device of FIG. 5, data are read from the normal memory cell arrays 1-0, 1-1, 1-2 and 1-3 and are transmitted via the bus selectors 12-0, 12-1, 12-2 and 12-3 to the read/write bus lines RWB0, RWB2, RWB1 and RWB3, respectively.

Also, in mode "2" of FIG. 8, when a defective memory cell is found in the normal memory cell array 1-0, the fuses of the redundancy column decoder 6-0 are trimmed, so that a column address (which is referred to as a defective column address) indicating the defective memory cell is written into the redundancy column decoder 6-0. Simultaneously, the fuse 31-0 of the selection circuit 7-0 is trimmed by a laser, so that, when the defective column address is supplied to the device, the selection circuit 7-0 disables the switch circuit 5-0. Also, the fuse 61-0 of the selection circuit 130-0 is trimmed by a laser, so that the redundancy data amplifier 10-0 is connected via the bus selector 11'-0 to the read/write bus line RWB0 when the defective column address is supplied to the device. On the other hand, the fuses 71-0, 71-3, 71-4 and 71-7 of the selection circuits 140-0, 141-2, 142-1 and 143-3 are trimmed by a laser. As a result, the normal data amplifiers 8-0, 8-1, 8-2 and 8-3 are always connected to the read/write bus lines RWB0, RWB2, RWB1 and RWB3, respectively. Therefore, when a row address signal $A_R$ and a defective column address signal $A_C$ for indicating the defective memory cell are supplied to the device of FIG. 5, data are read from the 20 redundancy memory cell column 2-0 and the normal memory cell arrays 1-1, 1-2 and 1-3 and are transmitted via the bus selectors 11'-0, 12-1, 12-2, 12-3 to the read/write bus lines RWB0, RWB2, RWB1 and RWB3, respectively. Thus, the defective memory cell is relieved.

Further, in mode "6" of FIG. 8, when an additional defective memory cell is found in the normal memory cell array 1-1, the fuses of the redundancy column decoder. 6-1 are also trimmed, so that an additional defective column address indicating the additional defective memory cell is written into the redundancy column decoder 6-1. Simultaneously, the fuse 31-1 of the selection circuit 7-1 is trimmed by a laser, so that, when the additional defective column address is supplied to the device, the selection circuit 7-1 disables the switch circuit 5-1. Also, the fuse 61-0 of the selection circuit 131-2 is trimmed by a laser, so that the redundancy data amplifier 10-1 is connected via the bus selector 11'-1 to the read/write bus line RWB2 when the additional defective column address is supplied to the device. On the other hand, the fuses 71-0, 71-3, 71-4 and 71-7 of the selection circuits 140-0, 141-2, 142-1 and 143-3 are trimmed by a laser. As a result, the normal data amplifiers 8-0, 8-1, 8-2 and 8-3 are always connected to the read/write bus lines RWB0, RWB2, RWB1 and RWB3, respectively. Therefore, when a row address signal $A_R$, and an additional defective column address signal $A_C$ for indicating the additional defective memory cell are supplied to the device of FIG. 5, data are read from the redundancy memory cell column 2-1 and the normal memory cell arrays 1-1, 1-2 and 1-3 and are transmitted via the bus selectors 11'-1, 12-0, 12-2 and 12-3 to the read/write bus lines RWB0, RWB2, RWB1 and RWB3, respectively. Thus, the two defective memory cells are relieved.

In FIG. 9, which is a layout diagram of the device of FIG. 5, an area for the bus selectors 11'-0, 11'-1, 12-0, 12-1, 12-2 and 12-3 is provided over the normal memory cell arrays and the redundancy memory cell columns. In this case, an area for the selection circuits 130-0, 130-1, 131-2, 131-3, 140-0, 140-2, 141-0, 141-2, 142-1, 142-3, 143-1 and 143-3 is provided over the normal memory cell arrays and the redundancy memory cell columns. Since the bus selector area and the selection circuit area are both uniform over the normal memory cell arrays and the redundancy memory cell columns, the layout design can be simplified. In addition, the speed of the read operation from the normal memory cell arrays 1-0, 1-1, 1-2 and 1-3 can be equal to the speed of the read operation from the redundancy memory cell columns 2-0 and 2-1.

In FIG. 10, which is also a layout diagram of the device of FIG. 5, the device is modified to a static random access memory (SRAM) device. In this case, data read from the memory cells are amplified by sense amplifiers and then led directly to the bus selectors. Even in the SRAM device to which the device of FIG. 5 is applied, the layout design can be simplified, and also, the speed of the read operation from the normal memory cell arrays can be equal to the speed of the read operation from the redundancy memory cell columns.

In FIG. 11, which illustrates a second embodiment of the 35 present invention, redundancy memory cell columns 2-2 and 2-3, redundancy column decoders 6-2 and 6-3, selection circuits 7-1 and 7-2, redundancy data amplifiers 10-2 and 10-3, bus selectors 11'-2 and 11'-3, selection circuits 132-1, 132-2, 133-0 and 133-3 are added to the device of FIG. 5. Thus, at most four defective memory cells can be relieved.

The operation of the device of FIG. 11 is shown in the table of FIG. 12. That is, as in modes "1" through "11" of FIG. 12, if no defective memory cell, one defective memory cell or two defective memory cells are found in the normal memory cell arrays 1-0, 1-1, 1-2 and 1-3, the operation of the device of FIG. 11 is the same as that of the device of FIG. 5.

In mode "12" of FIG. 12, when a third defective memory cell is found in the normal memory cell array 1-2, the fuses of the redundancy column decoder 6-2 are also trimmed, so that a third defective column address indicating the third defective memory cell is written into the redundancy column decoder 6-2. Simultaneously, the fuse 31-2 of the selection circuit 7-2 is trimmed by a laser, so that, when the third defective column address is supplied to the device, the selection circuit 7-2 disables the switch circuit 5-2. Also, the fuse of the selection circuit 132-1 is trimmed by a laser, so that the redundancy data amplifier 10-2 is connected via the bus selector 11'-2 to the read/write bus line RWB1 when the third defective column address is supplied to the device. On the other hand, the fuses 71-0, 71-3, 71-4 and 71-7 of the selection circuits 140-0, 141-2, 142-1 and 143-3 are trimmed by a laser. As a result, the normal data amplifiers 8-0, 8-1, 8-2 and 8-3 are always connected to the read/write bus lines RWB0, RWB2, RWB1 and RWB3, respectively. Therefore, when a row address signal $A_R$ and a defective column address signal $A_C$ for indicating the third defective memory cell are supplied to the device of FIG. 11, data are read from the redundancy memory cell column 2-2 and the normal memory cell arrays 1-0, 1-1 and 1-3 and are transmitted via the bus selectors 11'-1, 12-0, 12-1 and 12-3 to the read/write bus lines RWB0, RWB2, RWB1 and RWB3, respectively. Thus, the three defective memory cells are relieved.

Also, in mode "16" of FIG. 12, when a fourth defective memory cell is found in the normal memory cell array 1-3, the fuses of the redundancy column decoder 6-3 are further trimmed, so that a fourth defective column address indicating the fourth defective memory cell is written into the redundancy column decoder 6-3. Simultaneously, the fuse 31-3 of the selection circuit 7-3 is trimmed by a laser, so that, when the fourth defective column address is supplied to the device, the selection circuit 7-3 disables the switch circuit 5-3. Also, the fuse of the selection circuit 133-3 is trimmed by a laser, so that the redundancy data amplifier 10-3 is connected via the bus selector 11'-3 to the read/write bus line RWB3 when the fourth defective column address is supplied to the device. On the other hand, the fuses 71-0, 71-3, 71-4 and 71-7 of the selection circuits 140-0, 141-2, 142-1 and 143-3 are trimmed by a laser. As a result, the normal data amplifiers 8-0, 8-1, 8-2 and 8-3 are always connected to the read/write bus lines RWB0, RWB2, RWB1 and RWB3, respectively. Therefore, when a row address signal $A_R$, and a defective column address signal $A_C$ for indicating the third defective memory cell are supplied to the device of FIG. 11, data are read from the 15 redundancy memory cell column 2-3 and the normal memory cell arrays 1-0, 1-1 and 1-2 and are transmitted via the bus selectors 12-0, 12-1, 12-2 and 12-3 to the read/write bus lines RWB0, RWB2, RWBL and RWB3, respectively. Thus, the four defective memory cells are relieved.

Even in the second embodiment, the bus selector area and the selection circuit area are both uniform over the normal memory cell arrays and the redundancy memory cell columns, the layout design can be simplified. In addition, the speed of the read operation from the normal memory cell arrays 1-0, 1-1, 1-2 and 1-3 can be equal to the speed of the read operation from the redundancy memory cell columns 2-0, 2-1, 2-2 and 2-3.

In the above-described embodiments, the normal memory cell arrays 1-0, 1-1, 1-2 and 1-3 are arranged in a column direction. However, the normal memory arrays 1-0, 1-1, 1-2 and 1-3 can be arranged in a row direction. In this case, the redundancy memory cell columns 2-0, 2-1, 2-2 and 2-3 are replaced by redundancy memory cell rows.

As explained hereinabove, according to the present invention, the layout design can be simplified, and also, the speed of the read operation from the normal memory cell arrays can be equal to the speed of the read operation from the redundancy memory cell columns or rows.

I claim:

1. A semiconductor memory device comprising:

a plurality of bus lines;

a plurality of normal memory cell arrays;

a plurality of normal data amplifiers, each connected to one of said normal memory cell arrays, for amplifying data read from said normal memory cell arrays;

a plurality of first bus selectors, each connected to one of said normal data amplifiers and said bus lines, for selectively connecting said normal data amplifiers to said bus lines;

a plurality of redundancy memory cell arrays;

a plurality of redundancy data amplifiers, each connected to one of said redundancy memory cell arrays, for amplifying data read from said redundancy memory cell arrays; and a plurality of second bus selectors, each connected to one of said redundancy data amplifiers and said bus lines, for selectively connecting said redundancy data amplifiers to said bus lines.

2. The device as set forth in claim 1, further comprising:

a plurality of first selection circuits, each connected to one of said first bus selectors, each of said first selection circuits operating a respective one of said first bus selectors, so that a respective one of said normal data amplifiers is connected to one of said bus lines; and a plurality of second selection circuits, each connected to one of said second bus selectors, each of said second selection circuits operating a respective one of said second bus selectors, so that a respective one of said redundancy data amplifiers is connected to one of said bus lines.

3. The device as set forth in claim 1, wherein each of said first bus selectors comprises:

a first switch circuit connected between one of said normal data amplifiers and a first one of said bus lines, said first switch circuit being controlled by a first one of said first selection circuits; and a second switch circuit connected between said one of said normal data amplifiers and a second one of said bus lines, said second switch circuit being controlled by a second one of said first selection circuits, each of said first bus selectors comprising:

a third switch circuit connected between one of said redundancy data amplifiers and a third one of said bus lines, said third switch circuit being controlled by a first one of said second selection circuits, and a fourth switch circuit connected between said one of said redundancy data amplifiers and a fourth one of said bus lines, said fourth switch circuit being controlled by a second one of said second selection circuits.

4. The device as set forth in claim 2, further a plurality of redundancy decoders, each connected to one of said redundancy memory cell arrays, for selecting said redundancy memory cell arrays, each of said second selection circuits being connected to one of said-redundancy decoders, so that said second selection circuits are operated only when a respective one of said redundancy decoders selects one of said redundancy memory cell arrays.

5. The device as set forth in claim 1, wherein said bus lines are first, second, third and fourth bus lines, said normal memory cell arrays being first, second, third and fourth normal memory cell arrays, said normal data amplifiers being first, second, third and fourth normal data amplifiers, said first and second normal data amplifiers being selectively connected to said first and third bus lines, said third and fourth normal data amplifiers being selectively connected to said second and fourth bus lines, said redundancy memory cell arrays being first and second redundancy memory cell arrays, said redundancy data amplifiers being first and second redundancy data amplifiers, said first redundancy data amplifier being connected to said first and second bus lines, said second redundancy data amplifier being connected to said third and fourth bus lines.

6. The device as set forth in claim 1, wherein said bus lines are first, second, third and fourth bus lines, said normal memory cell arrays being first, second, third and fourth normal memory cell arrays, said normal data amplifiers being first, second, third and fourth normal data amplifiers, said first and second normal data amplifiers being selectively connected to said first and third bus lines, said third and fourth normal data amplifiers being selectively connected to said second and fourth bus lines, said redundancy memory cell arrays being first, second, third and fourth redundancy memory cell arrays, said redundancy data amplifiers being first, second, third and fourth redundancy data amplifiers, said first redundancy data amplifier being connected to said first and second bus lines, said second redundancy data amplifier being connected to said third and fourth bus lines, said third redundancy data amplifier being connected to said second and third bus lines, said fourth redundancy data amplifier being connected to said first and fourth bus lines.

* * * * *